United States Patent [19]

Takayama

[11] 4,369,446

[45] Jan. 18, 1983

[54] ANTENNA INPUT CIRCUIT

[75] Inventor: Kazuo Takayama, Kobe, Japan

[73] Assignee: Fujitsu Ten Limited, Kobe, Japan

[21] Appl. No.: 172,407

[22] Filed: Jul. 25, 1980

[30] Foreign Application Priority Data

Aug. 2, 1979 [JP] Japan .................................. 54-098882
Aug. 3, 1979 [JP] Japan .................................. 54-099346

[51] Int. Cl.³ .......................................... H01Q 11/12
[52] U.S. Cl. ................................... 343/711; 455/292
[58] Field of Search ..................... 343/701, 711–715, 343/856; 455/280, 290, 291, 292, 120, 121

[56] References Cited

U.S. PATENT DOCUMENTS 3,646,449  2/1972  Hellbarth et al. .................. 455/292
4,039,954  8/1977  Toonder ............................. 455/292
4,218,774  8/1980  Kondo ................................ 455/292

Primary Examiner—David K. Moore
Attorney, Agent, or Firm—Staas & Halsey

[57] ABSTRACT

An antenna input circuit for an electronic tuning type AM receiver for automobiles, which is connected to a capacitive antenna represented by an equivalent circuit composed of an antenna capacitance connected in series with an antenna electromotive force and a cable capacitance connected in parallel with them. A tuning transformer and a variable capacitance diode are connected in series with the capacitive antenna, and an additional capacitance is connected to the tuning transformer so that the current flowing in the additional capacitance also flows in one part of the tuning transformer, thereby providing an improved S/N ratio in the medium-frequency receiving band. Another capacitance is connected to the output terminal of the antenna input circuit, to reduce its output impedance. A capacitance for image interference ratio improving use is connected to the additional capacitance and the output impedance reducing capacitance.

7 Claims, 17 Drawing Figures

ANTENNA INPUT CIRCUIT

BACKGROUND OF THE INVENTION

1. Field for the Invention

This invention relates to an antenna input circuit of an electronic tuning type AM receiver for automobiles.

2. Description of the Prior Art

An antenna input circuit for a medium wave AM receiver which is mounted in an automobile, is usually the electronic tuning type using a variable capacitance diode. As, the antenna of an AM receiver of this kind, a whip antenna is widely employed. Since the whip antenna is capacitive, it is necessary that the variable capacitance diode in the electronic tuning type AM receiver have a sufficiently large capacitance variation range with respect to the antenna capacitance. But the capacitance variation range of the variable capacitance diode is not large enough; therefore, there have been various proposals for tuning in the medium-wave frequency range from 525 to 1605 KHz, and further, a problem of low S/N ratio has been presented.

In the past, use has been made of (a) a non-tuning input type, which amplifies the antenna output by a field effect transistor or the like and then applies the amplified signal to a tuning circuit, or (b) a tuning input type, which employs two variable capacitance diodes, one being connected in series with a tuning transformer and the other connected therewith in parallel. However, since the non-tuning input type (a) amplifies all signals received by the antenna, it has the defect of cross modulation, whereas the tuning input type (b) is free from cross modulation but defective in that the use of two variable capacitance diodes leads to an increased manufacturing cost and difficult tracking adjustment.

SUMMARY OF THE INVENTION

An object of the present invention is to improve the S/N ratio of the tuning input type antenna circuit which employs one variable diode.

Another object of the present invention is to improve the image interference ratio in the tuning input type antenna circuit.

Briefly stated, according to the present invention, in an antenna input circuit to which is connected a capacitive antenna (represented by an equivalent circuit in which an antenna capacitance is connected in series with an antenna electromotive force and a cable capacitance is connected therewith in parallel,) a variable capacitance diode and a tuning transformer are connected in series with the capacitive antenna; an additional capacitor is connected to an auxiliary winding or a tap of the tuning transformer, so that a portion of the current flowing in the additional capacitor flows in the tuning transformer, thereby improving the S/N ratio over the entire range of the working frequency band; a capacitor for low output impedance is connected to reduce the output impedance of the antenna input circuit; and a capacitor for improving the image interference ratio is connected to provide for improved image interference ratio over the entire range of the working frequency band.

DESCRIPTION OF THE PREFERRED EMBODIMENTS

Figure 1:
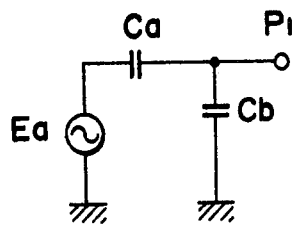
FIG. 1 is an equivalent circuit of a capacitive antenna.

A capacitive antenna, such as a whip antenna or the like, is represented by an equivalent circuit as shown in FIG. 1, in which an antenna capacitance Ca is connected in series with an antenna electromotive force Ea, and a cable capacitance Cb is connected therewith in parallel. Usually, the antenna capacitance Ca and the cable capacitance Cb are about 15 pF and 65 pF, respectively. In FIG. 1, reference character $P_1$ indicates an output terminal for connection with an antenna input circuit.

Figure 2:
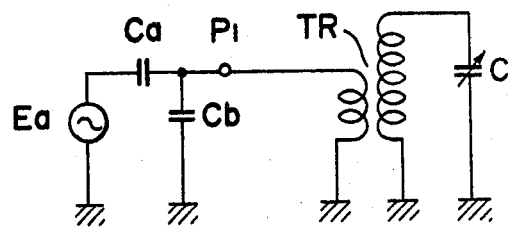
FIGS. 2 and 3 are circuit diagrams explanatory of an antenna input circuit employing one variable capacitance diode.
Figure 3:
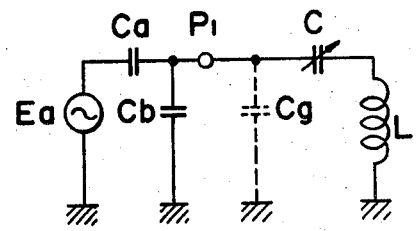

In the case of an antenna input circuit with one variable capacitance diode, one might consider a circuit arrangement as shown in FIG. 2 or 3. In FIG. 2, a variable capacitance diode C is connected to a secondary winding of a tuning transformer TR formed by primary and secondary windings, and the output terminal $P_1$ is connected to the primary winding. Accordingly, the capacitance on the side of the antenna, as viewed from the side of the secondary winding, is reduced, so that even if the capacitance variation ratio of the variable capacitance diode C (maximum capacitance C max/minimum capacitance C min) is 15 or so, the antenna can be tuned, by a suitable selection of the turn ratio between the primary and the secondary winding, within the medium-wave frequency range from 525 to 1605 KHz. As indicated by curve $C_1$ in the S/N characteristic diagram of FIG. 9, however, there is the defect that the S/N ratio is markedly degraded with a decrease in the frequency, that is, an increase in the capacitance of the variable capacitance diode C. This results from the division of the antenna electromotive force Ea by the antenna capacitance Ca, the cable capacitance Cb and the variable capacitance diode C.

In FIG. 3, a series circuit of a tuning transformer L and the variable capacitance diode C is connected to the output terminal $P_1$. In this circuit arrangement, it is necessary that the minimum capacitance of the variable capacitance diode C be extremely small for coverage of the medium-wave frequency band. In practice, however, the minimum capacitance C min of the variable capacitance diode C has its limit, and consequently an additional capacitance Cg indicated by the broken line is connected to permit coverage of the medium-wave frequency band. In this case, as indicated by curve $C_2$ in FIG. 9, the S/N ratio deteriorates considerably with an increase in the frequency, that is, a decrease in the capacitance of the variable capacitance diode C.

Figure 4:
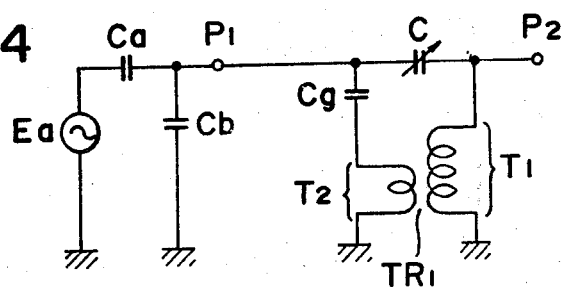
FIG. 4 is a circuit diagram illustrating an embodiment of the present invention.

FIG. 4 is a circuit diagram illustrating an embodiment of the present invention. A tuning transformer TR1 has a primary $T_1$ and a secondary winding $T_1$. The additional capacitance Cg mentioned above with respect to FIG. 3 is connected in series with the primary winding $T_2$ and the variable capacitance diode C is connected in series with the secondary winding $T_1$, forming an antenna input circuit. Reference character $P_2$ indicates an output terminal of the antenna input circuit; and Ea, Ca, Cb, and $P_1$ respectively designate the antenna electromotive force, the antenna capacitance, the cable capacitance, and the output terminal, which are identical to those shown in FIG. 3.

Letting the numbers of turns of the primary and secondary windings of the tuning transformer TR1 be represented by $T_2$ and $T_1$ respectively, letting the turn ratio $T_2/T_1$ be represented by m, (m<1) and letting the inductance of the secondary winding be represented by $L_0$, a resonance frequency $f_0$ is given by the following expressions in which $C_0$ is a tuning capacitance:

$$f_0 = \frac{1}{2\pi \sqrt{L_0 \cdot C_0}} \quad (1)$$

$$C_0 = \frac{m^2 Cg(Ca + Cb) + C\{Ca + Cb + Cg(1-m)^2\}}{Ca + Cb + Cg + C} \quad (2)$$

The S/N ratio of the circuit in this embodiment will be described in brief. If a noise source is assumed to be a loss in a resonance circuit, that is, a thermal noise of a resistance, then the resistance r is obtained from the Q of the resonance circuit as follows:

$$r = \frac{1}{\omega_0 \cdot C_0 \cdot Q} \quad (3)$$

where $\omega_0$ is a resonance angular frequency and $C_0$ is the tuning capacitance given by the expression (2).

A noise Vn generated by the resistance r is as follows:

$$Vn = \sqrt{4 \cdot k \cdot T \cdot B \cdot r} \quad (4)$$

$$\sqrt{\frac{4 \cdot k \cdot T \cdot B}{\omega_0 \cdot C_0 \cdot Q}}$$

where k is the Boltzmann's constant, T is the absolute temperature and B is the band width.

Accordingly, the S/N ratio at the output terminal $P_2$ during resonance is given by the following expression:

$$\frac{S}{N} Ea \cdot \frac{Ca(C + Cg \cdot m)Q^{\frac{1}{2}}}{(Ca + Cb + Cg + C)L_0^{\frac{1}{2}} \cdot C_0^{\frac{1}{2}}(4 \cdot k \cdot T \cdot B)^{\frac{1}{2}}} \quad (5)$$

As is apparent from the expression (5), the capacitance (indicated by the same reference character C as the variable capacitance diode C) of the variable capacitance diode C is included in the denominator and the numerator; accordingly, even if the abovesaid capacitance C is varied for tuning to a desired frequency, its influence is cancelled by the denominator and the numerator and the S/N ratio tends to remain constant.

Figure 9:
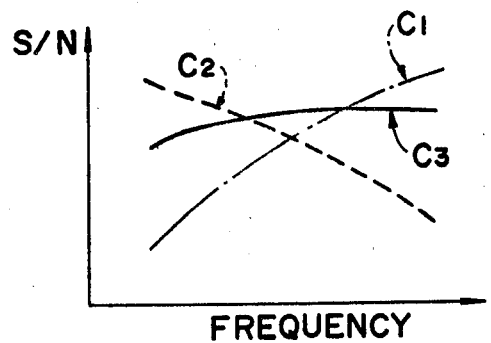
FIG. 9 is a graph showing S/N characteristics.

For example, in the case where Ca and Cb are respectively selected to be 15 pF and 65 pF as described previously and Cg=1500 pF and m=0.15, a medium wave broadcasting frequency band can be covered, with the capacitance variation ratio of the variable capacitance diode held to 15 or so, and the S/N ratio becomes substantially constant as indicated by curve $C_3$ in FIG. 9; namely, the S/N ratio is not markedly degraded.

Figure 5:
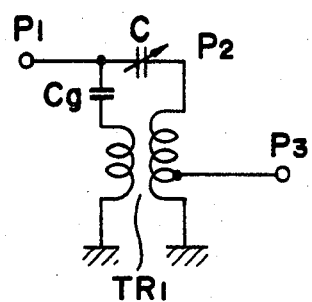
FIG. 5 is a circuit diagram showing another embodiment of the present invention.

Since a transistor amplifier circuit is connected to the output terminal $P_2$ of the antenna input circuit, the output impedance is required to be low. This requirement can be fulfilled by providing, as an output terminal $P_3$, a tap in the secondary winding of the tuning transformer TR1, as illustrated in FIG. 5.

Figure 6:
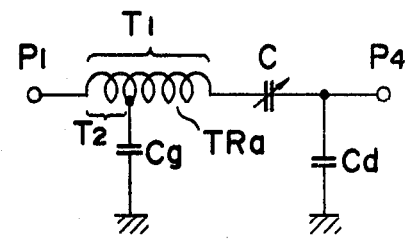
FIG. 6 is a circuit diagram showing another embodiment of the present invention.

FIG. 6 is a circuit diagram showing another embodiment of the present invention, in which tuning transformer TRa has an auto-transformer construction with the additional capacitance Cg connected to its tap; the variable capacitance diode C is connected in series with the tuning transformer TRa between terminals $P_1$ and $P_4$; and a capacitance Cd for output impedance reduction is connected to the output terminal $P_4$. The numbers of turns $T_2$ and $T_1$, respectively corresponding to the primary and secondary windings of the tuning transformer TRa, are selected to be the same as the numbers of turns $T_1$ and $T_2$ of the tuning transformer TR1 in FIG. 4.

Now, a description will be given of the relationship between the embodiments of FIGS. 6 and 4.

Figure 7A:
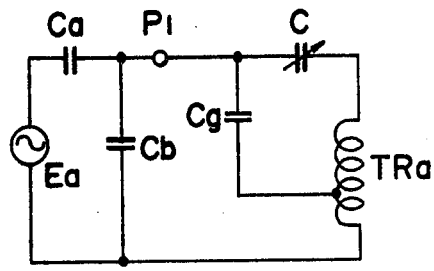
FIGS. 7A to 7C shows a series of circuit diagrams explanatory of the process of modification of the embodiment depicted in FIG. 6.
Figure 7B:
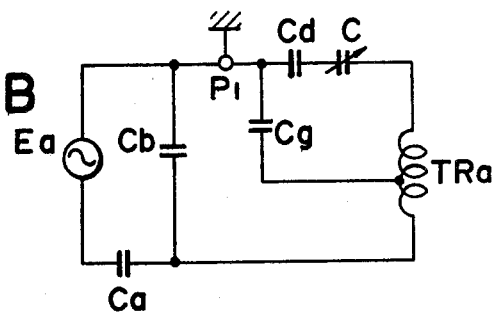
Figure 7C:
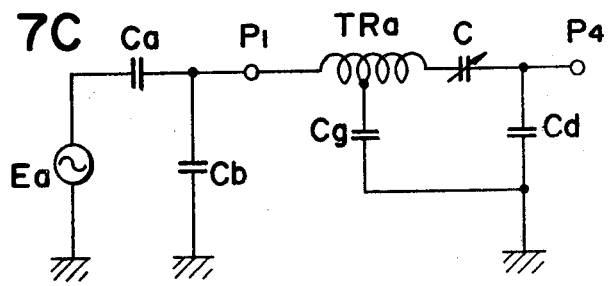

If the tuning transformer TR1 in FIG. 4 is made into an auto-transformer, the circuit arrangement becomes such as shown in FIG. 7A. Then, after grounding the output terminal $P_1$ of the capacitance antenna, changing the position of the antenna capacitance Ca, and connecting the capacitance Cd whose capacitance value is so large as to have no effect on resonance, the circuit arrangement becomes such as depicted in FIG. 7B. And then, using the connection between the variable capacitance diode C and the capacitance Cd for output impedance reduction as the output terminal $P_4$, a circuit arrangement as shown in FIG. 7C results. The circuit arrangement in FIG. 7C is identical with that in FIG. 6, and the output impedance of the antenna input circuit is reduced by the capacitance Cd connected between the output terminal $P_4$ and the ground.

Figure 8:
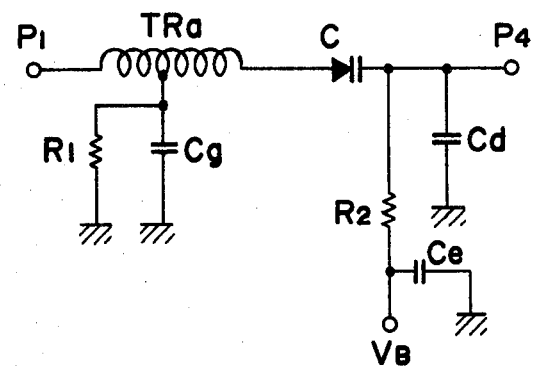
FIG. 8 is a specific circuit diagram of the embodiment of FIG. 6 including a bias voltage supply circuit.

FIG. 8 illustrates a specific operative example which includes a DC bias circuit for the variable capacitance diode C. In FIG. 8 the parts corresponding to those in FIG. 6 are identified by the same reference characters. Reference characters $R_1$ and $R_2$ indicate resistors; Ce designates a capacitor for high frequency by-pass use; and $V_B$ identifies a bias voltage. The capacitance of the variable capacitance diode C is controlled by the application of the bias voltage $V_B$ via the resistors $R_1$ and $R_2$ and the tuning transformer TRa. The output impedance is lowered by the capacitance Cd. Furthermore, the additional capacitance Cg is connected to the tap of the tuning transformer TRa to apply to one part of the tuning transformer TRa the current flowing in the additional capacitance Cg, by which the S/N ratio in the working frequency band can be improved.

Figure 10:
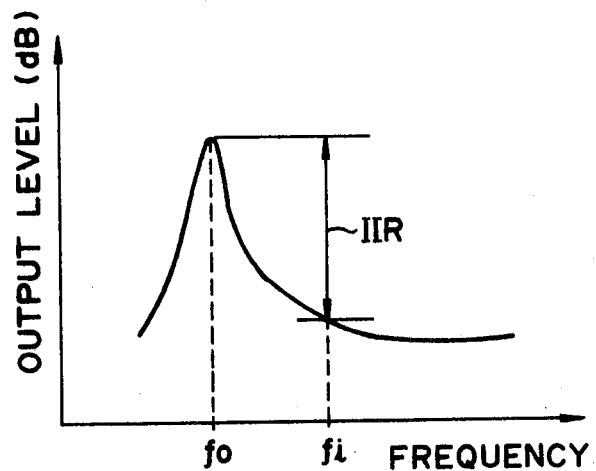
FIG. 10 is a graph showing a resonance curve.
Figure 11:
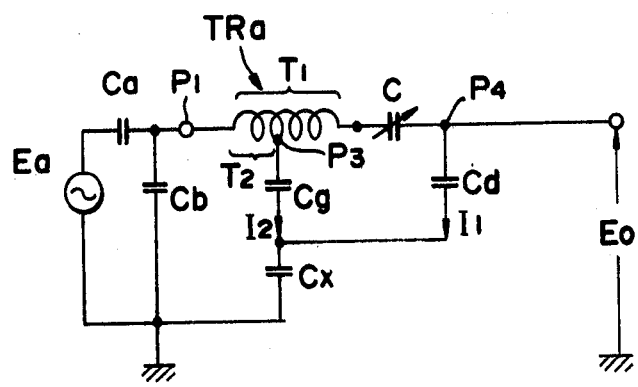
FIG. 11 is a circuit diagram illustrating a further embodiment of the present invention.

FIG. 10 is a graph which shows the resonance characteristic of the abovesaid antenna input circuit. The difference between the output level (dB) at the resonance frequency $f_0$ and the output level (dB) at an image frequency $f_i$ is shown as an image interference ratio IIR. The lower the output level (dB) at the image frequency $f_i$ is, the more the image interference ratio IIR is enhanced. FIG. 11 illustrates another embodiment of the present invention which is designed to improve the image interference ratio, the parts corresponding to those in FIG. 6 being marked with the same reference characters. In the illustrated embodiment, the capacitances Cg and Cd in the embodiment of FIG. 6 are interconnected at their grounding side and connected to a capacitance Cx. The capacitance Cx is selected to be larger than the capacitance of the variable capacitance diode C, the antenna capacitance Ca, and the cable capacitance Cb. Accordingly, the capacitance Cx has substantially no effect on the resonance frequency, but produces the effect of lowering the output voltage Eo corresponding to an input signal remote from the resonance frequency.

A current $I_1$ flowing in the capacitance Cd and a current $I_2$ flowing in the additional capacitance Cg are opposite in phase with respect to signals at frequencies higher than the resonance frequency, and bear a relationship such as $|I_2| > |I_1|$. Accordingly, the voltage Vx across the capacitance Cx is opposite in phase to a voltage Vd across the capacitance Cd, so that by selecting the values of the capacitances Cx and Cd to provide the relationship, Vx=Vd, it is possible to reduce the output voltage Eo to zero at a certain frequency higher than the resonance frequency.

Figure 12:
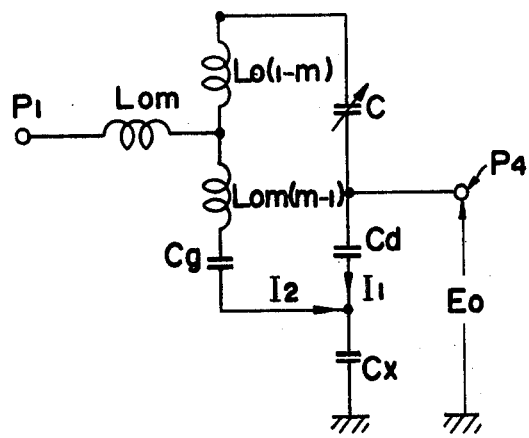
FIG. 12 is an equivalent circuit diagram of the principal part of the embodiment shown in FIG. 11.

FIG. 12 shows an equivalent circuit of the antenna input circuit depicted in FIG. 11, in which the tuning transformer is shown in the form of a T-circuit. If the inductance of that part of the tuning transformer TRa in FIG. 11 which has the number of turns $T_1$ is taken as $L_0$, there is formed a T-circuit with $L_0 \cdot m$, $L_0(1-m)$ and $L_0 m(m-1)$, where m is represented by $m = T_2/T_1$, $T_2$ being the number of turns of the part corresponding to the primary winding of the tuning transformer Tra and $T_1$ the number of turns of the part corresponding to its secondary winding, as mentioned previously.

If the coupling coefficient between the primary and secondary windings of the tuning transformer TRa is assumed to be 1, then the following expression holds:

$$I_1 \left( p \cdot L_0(1-m) + \frac{1}{p \cdot Cod} \right) = I_2 \left( p \cdot L_0 \cdot m(m-1) + \frac{1}{p \cdot Cg} \right) \quad (6)$$

where $p = j\omega$ and $$Cod = \frac{C \cdot Cd}{C + Cd}$$

The output voltage Eo is given as follows:

$$Eo = \frac{I_1 + I_2}{p \cdot Cx} + \frac{I_1}{p \cdot Cd} = \quad (7)$$

$$I_1 \frac{Cx \cdot Cod + Cod \cdot Cd + Cg \cdot Cd - \omega^2 \cdot L_0 \cdot Cod \cdot Cg(1-m)\{(1-m)Cd - m \cdot Cx\}}{j\omega \cdot Cx \cdot Cd \cdot Cod \{1 + \omega^2 \cdot L_0 \cdot Cg \cdot m(1-m)\}}$$

Figure 13:
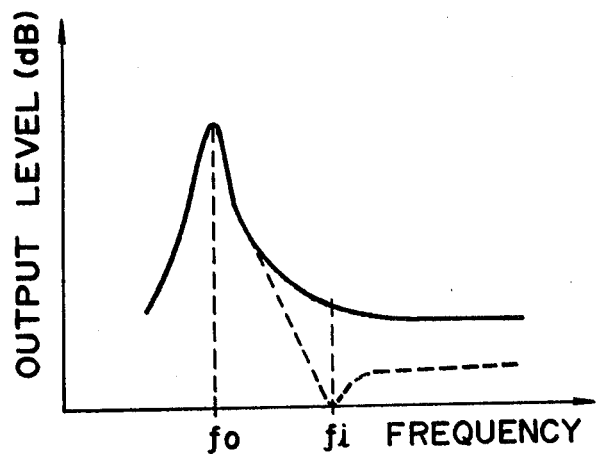
FIGS. 13 and 14 are graphs showing resonance curves explanatory of the effect produced by the present invention.

When the angular frequency $\omega$ is $\omega_i$, given by the following expression:

$$\omega_i = \sqrt{\frac{C(Cx + Cd + Cg) + Cg \cdot Cd}{L_0 \cdot C \cdot Cg(1-m)\{Cd(1-m) - Cx \cdot m\}}} \quad (8)$$

the numerator in the expression (7) is zero, that is, the output voltage Eo is zero. Accordingly, by selecting the capacitance Cx so that the angular frequency at the image frequency $f_i$ may be equal to the angular frequency $\omega_i$ given by the expression (8), the resonance characteristic indicated by the solid line in FIG. 13 can be changed to that indicated by the broken line; namely, the output level at the image frequency $f_i$ can be reduced to zero.

In the prior art, a trap circuit may sometimes be provided for improving the image interference ratio, but since a trap frequency is usually fixed, the trap circuit cannot produce the effect of improving the image interference ratio when the image frequency differs from the trap frequency. In the present invention, however, the capacitance of the variable capacitance diode C is controlled to vary the resonance frequency $f_0$ with the image frequency $f_i$, but since the angular frequency $\omega_i$ is also varied, as is seen from the expression (8), the image interference ratio can be improved for every resonance frequency $f_0$.

Figure 14:
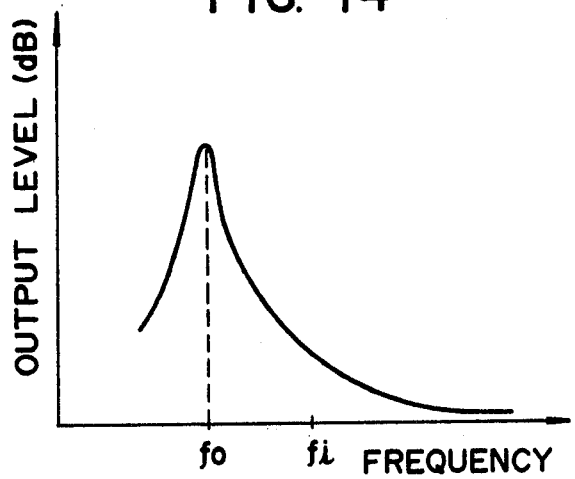

Furthermore, the term in the brace in the numerator of the expression (7) can be made smaller than the capacitance Cx, and by selecting the capacitance Cx (for image interference ratio improving use) so that $\{(1-m)Cd - m \cdot Cx\} = 0$, that is, $$Cx = \frac{(1-m)Cd}{m},$$

there can be obtained the resonance characteristic shown in FIG. 14. This means that the angular frequency $\omega_i$ is selected to be infinitely large.

Figure 15:
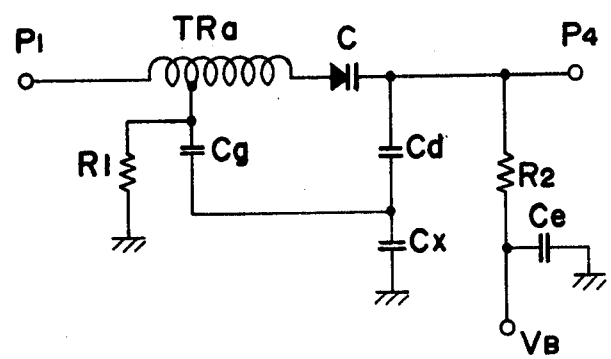
FIG. 15 is a specific circuit diagram of the embodiment of FIG. 11 including a bias voltage supply circuit.

FIG. 15 is a circuit diagram illustrating a specific operative example which includes a bias voltage supply circuit for the variable capacitance diode C and in which the parts corresponding to those in FIGS. 8 and 11 are identified by the same reference characters. In FIG. 15, a bais voltage $V_B$ is applied, via the resistors $R_1$ and $R_2$ and the tuning transformer TRa, to the variable capacitance diode C to control its capacitance in order to provide a signal of a desired resonance frequency at the output terminal $P_4$. The output impedance is made small by the capacitance Cd, and the image interference ratio is improved by the capacitance Cx.

As has been described in the foregoing, according to the present invention, it is possible, with the use of one variable capacitance diode, to constitute a tuning input type antenna input circuit capable of covering the medium-wave AM broadcasting frequency range with a substantially constant S/N ratio over that frequency range. Further, the image interference ratio can be improved. Consequently, the receiving characteristic of the antenna input circuit in an electronic tuning type AM receiver for automobiles is enhanced.

It will be apparent that many modifications and variations may be effected without departing from the scope of the novel concepts of this invention.

What is claimed is:

1. An antenna input circuit of an electronic tuning type AM receiver for automobiles which is connected to a capacitive antenna represented by an equivalent circuit composed of an antenna capacitance connected in series with an antenna electromotive force to an output terminal of the capacitive antenna and a cable capacitance connected in parallel with them, said antenna input circuit and comprising:
   a tuning transformer comprising a winding having a tap;
   a variable capacitance diode connected in series between the capacitive antenna and said output terminal;
   an additional capacitance connected at a first terminal thereof to said tap of said tuning transformer;
   a capacitance for reducing the output impedance of said antenna input circuit, connected at a first terminal thereof to said output terminal; and
   a capacitance for improving the image interference ratio connected between the respective second terminals of said additional capacitance and said output impedance reducing capacitance and ground.

2. The antenna input circuit of claim further comprising:
   a first resistor connected in parallel to said additional capacitance;
   a second resistor having a first terminal connected to said output terminal, and a second terminal; and
   a bypass capacitor connected between said second terminal of said second resistor and ground.

3. An antenna input circuit of an electronic tuning type AM receiver for automobiles, which is connected to a capacitive antenna represented by an equivalent circuit composed of an antenna capacitance connected in series with an antenna electromotive force to an output terminal of the capacitive antenna and a cable capacitance connected in parallel with them, said antenna input circuit comprising:
   a tuning transformer comprising a winding having a tap;
   a variable capacitance diode connected in series between the capacitive antenna and said output terminal;
   an additional capacitance connected between said tap of said tuning transformer and ground; and
   a capacitance for reducing the output impedance of said antenna input circuit, connected between said output terminal and ground.

4. An antenna input circuit of an electronic tuning type AM receiver for automobiles, which is connected to a capacitive antenna represented by an equivalent circuit composed of an antenna capacitance connected in series with an antenna electromotive force to an output terminal of the capacitive antenna and a cable capacitance connected in parallel with same, said antenna input circuit comprising:
   a tuning transformer and a variable capacitance diode connected in series to said capacitive antenna; and
   an additional capacitance connected to said tuning transformer so that a current may flow in one part of the winding of said tuning transformer through said additional capacitance.

5. An antenna input circuit according to claim 4, wherein said tuning transformer comprises a primary winding with a secondary winding having a larger number of turns than said primary winding, wherein said additional capacitance is connected between said primary winding and the capacitive antenna, and wherein said variable capacitance diode is connected between said secondary winding and the capacitive antenna.

6. The antenna input circuit of claim 5, wherein said secondary winding of said tuning transformer further comprises a tap, said tap being connected as an output terminal of the antenna input circuit.

7. An antenna input circuit according to claim 4, wherein said tuning transformer has a tap to which said additional capacitance is connected.

* * * * *

UNITED STATES PATENT AND TRADEMARK OFFICE
CERTIFICATE OF CORRECTION

PATENT NO. : 4,369,446

DATED : January 18, 1983

INVENTOR(S) : Kazuo Takayama

It is certified that error appears in the above-identified patent and that said Letters Patent is hereby corrected as shown below:

Front Page, [56] References Cited, "Toonder" should be --den Toonder--

Col. 1, line 7, "of" should be --for--;

line 10, after "circuit" insert --,--;

line 13, after "As" delete ",";

line 51, ",)" should be --),--.

Col. 2, line 10, "shows" should be --show--.

Col. 3, line 53, before equation insert --=--.

Col. 5, line 56, after equation insert --.--.

Col. 7, line 12, delete "and";

line 29, after "claim" insert --1 or 3,--.

Signed and Sealed this

Eighteenth Day of March 1986

[SEAL]

Attest:

DONALD J. QUIGG

Attesting Officer

Commissioner of Patents and Trademarks